United States Patent [19]
Yamamoto

[11] Patent Number: 5,945,849
[45] Date of Patent: Aug. 31, 1999

[54] PHASE ERROR SIGNAL GENERATOR

[75] Inventor: Takeshi Yamamoto, Tokyo, Japan

[73] Assignee: Kabushiki Kaisha Toshiba, Kawasaki, Japan

[21] Appl. No.: 08/818,397

[22] Filed: Mar. 14, 1997

[30]         Foreign Application Priority Data

Mar. 15, 1996    [JP]    Japan .................................... 8-058985

[51] Int. Cl.$^6$ ............................................... G01R 25/00
[52] U.S. Cl. .................... 327/12; 327/3; 327/91
[58] Field of Search ............... 327/2, 3, 12, 91, 327/94

[56]              References Cited

U.S. PATENT DOCUMENTS

| | | | |
|---|---|---|---|
| 4,151,473 | 4/1979 | Coleman et al. | 327/91 |
| 4,740,940 | 4/1988 | Tanaka et al. | 369/44 |
| 5,157,014 | 10/1992 | Saiki et al. | 331/1 A |
| 5,331,230 | 7/1994 | Ichihara | 327/94 |

FOREIGN PATENT DOCUMENTS

| | | |
|---|---|---|
| 0 500 014 A2 | 8/1992 | European Pat. Off. . |
| 0 540 052 A1 | 5/1993 | European Pat. Off. . |
| 62-020145 | 1/1987 | Japan . |
| 5-080053 | 11/1993 | Japan . |

Primary Examiner—Toan Tran
Attorney, Agent, or Firm—Pillsbury Madison & Sutro LLP

[57]              ABSTRACT

A phase error signal generator including a phase comparator for comparing phases of two input pulse signals, change over the output polarity according to phase lead and lag between said input pulse signals, and output an electric charge proportional to a time difference between said input pulse signals, an alternating front stage capacitor for charging an electric charge according to said time difference, a base-grounded transistor of which emitter is coupled to said front stage capacitor, a rear stage capacitor coupled to the collector of said transistor, and a switch controller for biasing said transistor until the next edges arrive after detecting the edges corresponding to said two input pulse signals, wherein an integrating voltages of phase error of said two input pulse signals is obtained from said rear stage capacitor by transferring the electric charge proportional to the time difference information of each edge of the input pulse signal generated in said front stage capacitor in order.

11 Claims, 7 Drawing Sheets

PHASE ERROR SIGNAL GENERATOR

FIELD OF THE INVENTION

The present invention relates to a phase error signal generator suited for generating tracking servo signals in optical disc systems such as digital video disc (DVD) systems.

BACKGROUND OF THE INVENTION

In recent years, reproducing apparatus for optical discs such as digital video discs (hereinafter referred to DVD) which carry optical record information of digitally compressed video signals or data handled in personal computers, etc. have been proposed and efforts are intensively concentrated to bring the commercial stage. The DVDs feature a recording density far higher than conventional compact discs so that movies exceeding two hours can be recorded on one side of a single disc having the same 12 cm diameter as compact discs.

To accurately reproduce information from such a recording medium, an accurate and precise tracking servo is required. Therefore, it becomes necessary to precisely generate a tracking error signal from pickup signals. In the DVD system, a method of detecting a tracking error by receiving reflected lights from a beam spot irradiated from a laser using a photo-detector divided into four diagonally arranged photoreceptive cells. The outputs outputs of two diagonal cells are then summed so as to detect a phase error between the outputs as the tracking error. Such a method is considered the best from the nature standard of the DVD system. This method is based on the principle that a phase error occurs between the two sets of the sums of the diagonal components by a tracking error. It is then called "phase error-based tracking error generation".

A Japanese laid-open Application Tokkai-Sho 58(1983)-150144 discloses a tracking error generator embodying the system, while a Japanese published Application Tokko-Hei 05(1993)-80053 discloses a further improvement of the sort of the tracking error generator. In a practical configuration of the tracking error signal generators for DVDs having a very high record density, it is required to detect a phase error at a high speed and a high accuracy for every pulse. Thus such a tracking error signal generator faces some very difficult problems. For instance, the Japanese published Application Tokko-Hei 05(1993)-80053 discloses a tracking error signal generator, as shown in FIG. 6, which sequentially integrates phase comparison results for every pulse so as to eliminate an affect caused by any defective waveform correspondency occurring in the combination of pulse signals.

Figure 6:
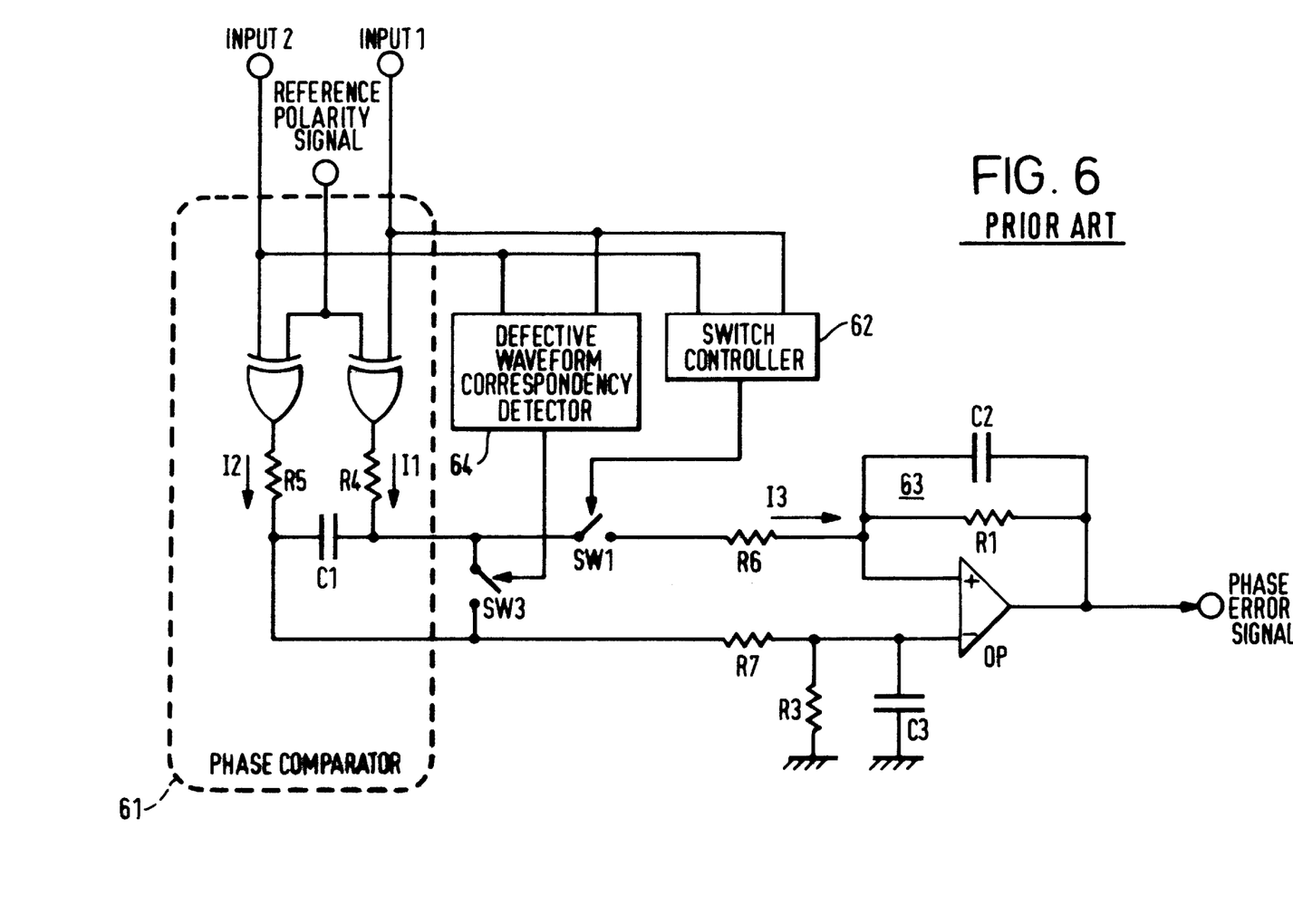
FIG. 6 is a circuit diagram for explaining a conventional phase error signal generator for generating tracking error signals.
Figure 7:
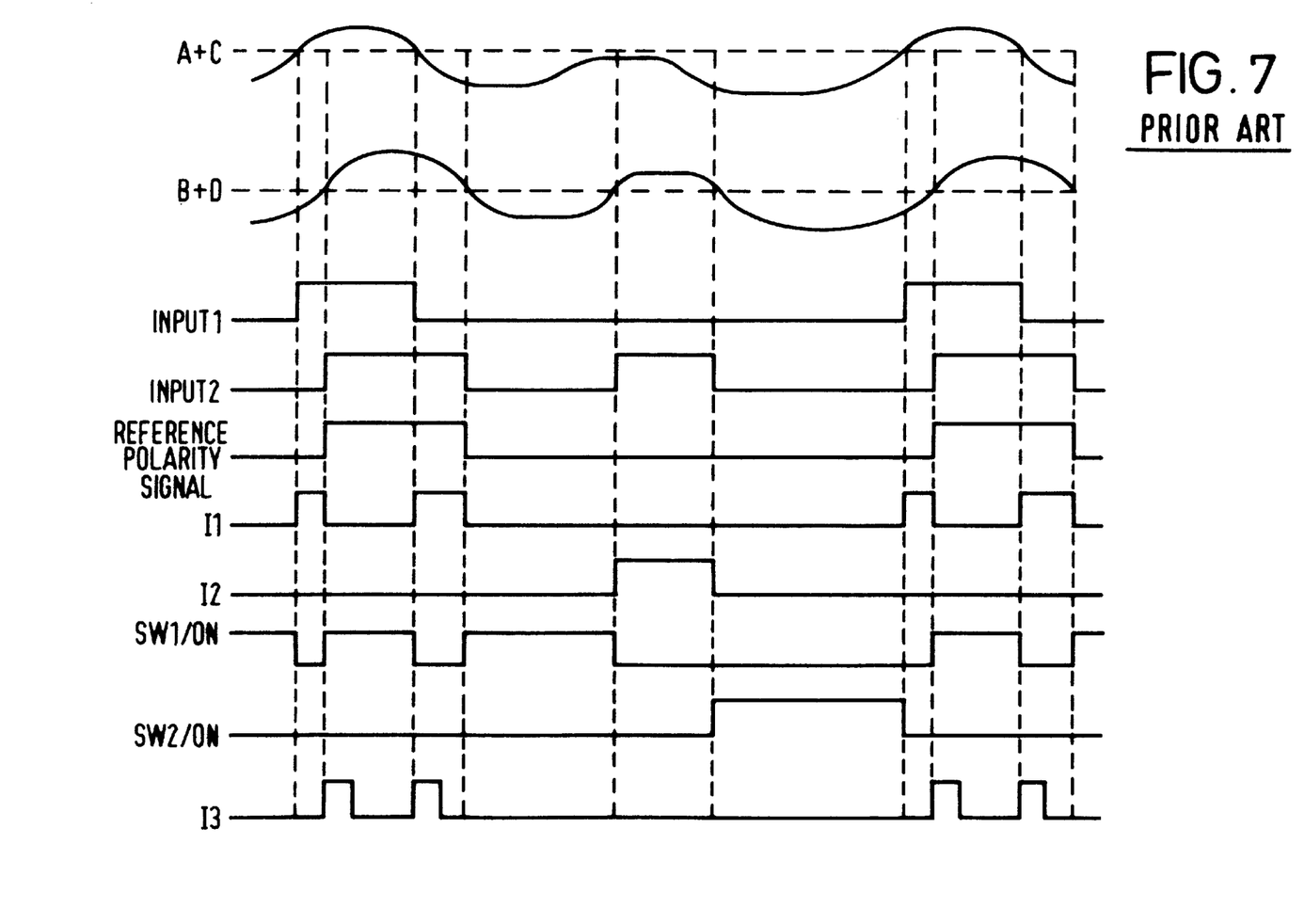
FIG. 7 is a waveform diagram for explaining the operation of the conventional circuit, as shown in FIG. 6.

Now, the operation of the prior art circuit, as illustrated in FIG. 6, will be described in reference to a waveform diagram, as shown in FIG. 7. Two sets of diagonal sum signals A+C and B+D obtained from photodetectors having four photoreceptive cells A, B, C and D are assumed to have a phase error therebetween in response to an amount of the tracking error, as shown in FIG. 7. An input pulse signal 1 is a binary rectangular pulse signal obtained by wave-shaping the diagonal sum signal A+C, while another input pulse signal 2 is another binary rectangular pulse signal obtained by wave-shaping the other diagonal sum signal B+D. A reference polarity (RP) signal is produced from the input pulse signals 1 and 2 as that it has a trailing edge which arises at the leading edge of a delayed one of the corresponding pulses in the input pulse signals 1 and 2, and a trailing edge which arises at the trailing edge of a delayed one of the corresponding pulses in the input pulse signals 1 and 2.

Those three input signals 1, 2 and RP are supplied to a phase comparator 61, as shown in FIG. 6. The phase comparator 61 operates EX-OR (Exclusive-OR) operations on a first combination of the input pulse signal 1 and the reference polarity signal RP, and a second combination of the input pulse signal 2 and the reference polarity signal RP. In the phase comparator 61, the EX-OR outputs are further converted into current signals through resistors R4 and R5 and then charged into a front stage capacitor C1. If the input pulse signal 1 advances in phase to the input pulse signal 2, the EX-OR output associated with the input pulse signal 1 takes the High level for the periods of the phase error (i.e., between the leading edges of the input pulse signal 1 and the reference polarity signal RP and the trailing edges of the input pulse signal 1 and the reference polarity signal RP). A current It then flows through the resistor 4 to charge the capacitor C1 for the duration of the high level. On the other hand, if the input pulse signal 1 delays in phase than the input pulse signal 2, the EX-OR output associated with the input pulse signal 2 takes the high level for the period of the phase error (i.e., between the leading edges of the input pulse signal 2 and the reference polarity signal RP and the trailing edges of the input pulse signal 2 and the reference polarity signal RP). Another current I2 then flows through the resistor R5 to charge the capacitor C1 in the reverse direction.

During the above operations, switches SW1 and SW2 are kept open. A duration from an instance when corresponding two edges of the input pulses have arrived to another instance when either one of corresponding edges of following pulses arrives, the switch SW1 is kept ON, as shown in FIG. 7. The condition keeping the switch SW1 ON is determined by a switch controller 62 which is configured in a logic circuit. When the switch SW1 is kept ON, the capacitor C1 is coupled to an integrator 63 which is comprised of an operational amplifier OP and a capacitor C2. The operational amplifier OP so operates that the voltage between inputs becomes zero.

The electric charge charged in the capacitor C1, having a charge amount in proportion to the phase error, is then transferred to the capacitor C2 (see current I3). Thus the charge across the capacitor C1 has been automatically reset to zero before arriving of next input pulses by the operational amplifier operation. The electric charge is transferred at a speed limited by the bandwidth of the operational amplifier. In this charge transfer operation, a relatively large rush of current flows. Then resistors R6 and R7 are inserted along the current paths for suppressing the rush currents below their reasonable current levels.

Thus, the electric charge charged in the capacitor C1 for every input pulse is sequentially transferred to the rear stage capacitor C2, thus the electric charges are integrated in the capacitor C2. A voltage having a mean value corresponding to the phase error is then produced at the output of the integrator 63. The voltage output is thus utilized as a tracking error signal. When any defective waveform correspondence occurs in the combination of the inputs I1 and I2, a defective waveform correspondency detector 64 detects the defective waveform correspondency to close the switch SW3 for resetting the charge of the capacitor C1. Thus the tracking error signal produced from the integrator 63 is shut out from the affection of the defective waveform correspondency. As shown in FIG. 7, in the illustrative diagonal sum signal A+C, its second peak fails to reach the threshold level for binarization. So that, a binarized rectangular pulse signal of the corresponding second peak of the other diagonal sum signal B+D results in an isolated pulse.

In this case, the switch controller 62 does not close the switch SW1 so that the electric charge of the capacitor C1 fails to be transferred. While the switch SW3 is turned ON by a defective waveform correspondency detector 64 immediately after the trailing edge of the input pulse signal 2 to short-circuit both ends of the front stage capacitor C1. Thus in the occurrence of the defective waveform correspondency the charge of the front stage capacitor C1 is reset without being transferred to the rear stage capacitor C2.

However, the prior art circuit, as shown in FIG. 6, has the disadvantage that it is difficult to adapt to the high speed operation required in a DVD system, and it can not accurately operate in such high speed operation systems. Because such processings require high speed performance, low offset and low S/N ratios, the IC is implemented using a bipolar process. The prior art circuit, as shown in FIG. 6, however has several problems in attempting its IC integration by the bipolar process.

First, it is difficult to realize a bidirectional current ON/OFF switch for the first switch SW1. To realize such a bidirectional current switch, requires a bidirectional current switch function by a diode bridge, as shown in FIG. 8, which turns ON/OFF in response to the activation/deactivation of bias currents.

In such a bidirectional current switch, a bias current source IS1 associated with a power source Vcc, is constructed by PNP transistors, while another bias current source IS2 associated with a ground source is constructed by NPN transistors. The PNP transistors and the NPN transistors are different in their response characteristics with each other. Thus, the bias current sources using transistors of different conductivity types can not be completely turned ON/OFF at the same time. Further, the current capacities of the bias current sources are required to be larger than the maximum current which flows for the transfer of the electric charge. The capacity of the bias current sources can not be reduced.

Figure 8:
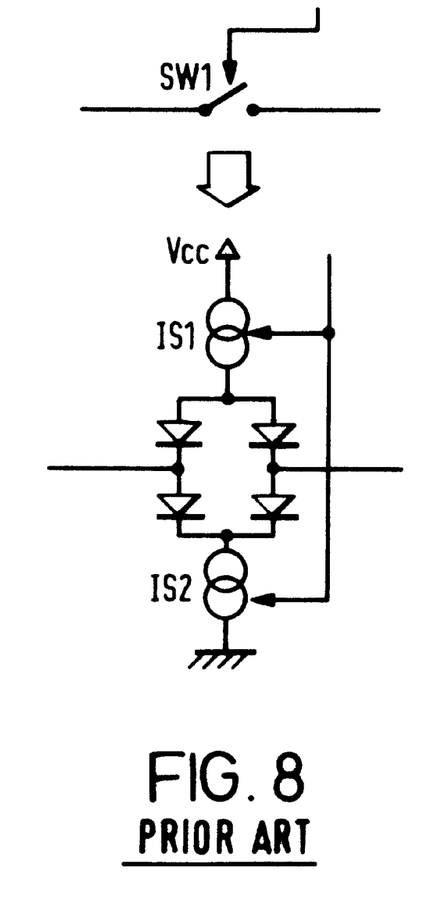
FIG. 8 is a circuit diagram for explaining a definite example of the switch used in the conventional circuit, as shown in FIG. 6.

Accordingly, in the prior art phase error detector, using the bidirectional current switch, as shown in FIG. 8, a large offset current flows into the front and rear stage capacitors C1 and C2, provided that the ON/OFF response times of the PNP and NPN transistors are small, thereby deteriorating the accuracy of the phase error signal generation. In practice, the DVD systems require that the the phase error offset be suppressed below several nsecs. Thus the difference of the ON/OFF timing must be reduced below such several nsecs. However at present there is no means to sufficiently reduce the difference. Further, a current continues to flow for a while after the charge transfer has completed at the time that the bias current sources are turned ON. Thus, the difference of the currents of the bias current sources flows into the integrator 63 still after the completion of the charge transfer, thereby causing inaccuracy of the phase error signal generation.

Figure 9:
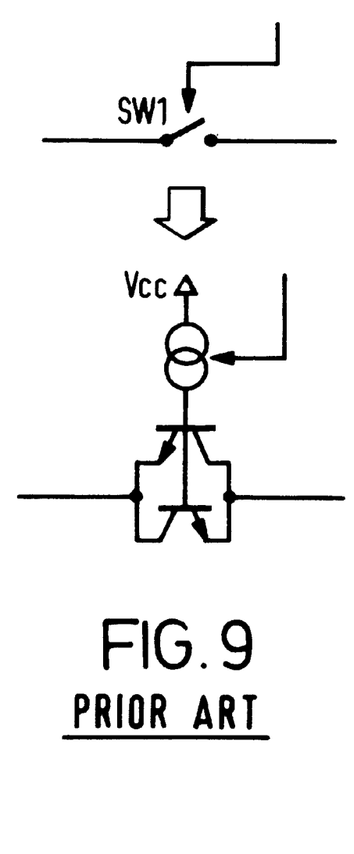
FIG. 9 is a circuit diagram for explaining another definite example of the switch used in the conventional circuit, as shown in FIG. 6.

In this case too, there arises the serious problem that it is difficult to balance the accuracies of both bias current sources since they are made of the different conductivity type transistors. When an almost correct tracking is carried out, the phase error signal output approaches zero. In this state, the error detecting operation tine is shortened for a very short portion within a duration until next pulse, while the ON state of the switch SW1 for transferring the electric charge extends for almost the entire portion of the duration. Provided the amount of current offset is small, a considerably large error occurs in the generated error signal. In place of the diode-bridge, there is another approach of realizing a bidirectional current switch function by a saturation switch, as shown in FIG. 9. In this case, the saturation switch still has problems that it causes a large voltage offset and a slow operation. Thus the case of the saturation switch still has a considerably large error.

Furthermore, the prior art circuit, as shown in FIG. 6, has the problem that the operational amplifier OP do not have the characteristics necessary to achieve high-speed operations. In general, an output stage of the operational amplifier is constructed in a push-pull circuit configuration comprising PNP and NPN transistors. In this push-pull configuration, an active side of the transistors changes depending on whether the transfer of the electric charge charges or discharges the rear stage capacitor C2. In normal bipolar ICs, PNP transistors have a lateral structure while NPN transistors have a vertical structure, thus there exists remarkable difference between them in their high speed operation characteristics according to the structural difference.

Thus, a large difference occurs between the speeds of the charging operation and discharging operation. This difference of the operating speeds further results in a difference of advance and delay of phases. Viewed from a phase error characteristic curve, there arises a difference in the amounts of tilting of the curves in opposite sides in relation to a zero phase origin point. In case that the output stage has an NPN emitter-follower configuration, as well as the case of the push-pull type output stage, the difference of the operating speeds results in a charging operation to the emitter electrode of the NPN transistor and a constant-current discharging from the collector electrode of the NPN transistor. The charging and the constant-current discharging still result in a large difference of characteristics between the advance and delay of phases. In addition, an offset between two input currents is taken into account as a factor of causing the difference.

In case of a conventional phase error signal generator which transfers electric charge using an operational amplifier and an ON/OFF switch, there was such problems that it would not be possible to obtain a sufficient performance for such discs as DVD requiring operations in both high accuracy and high speed.

SUMMARY OF THE INVENTION

It is, therefore, an object of the present invention to provide a phase error signal generator which includes the sequential transfer of electric charge for generating the tracking error in the reproduction of optical discs, such as DVD, which require high accuracy and high speed.

In order to achieve the above object, a phase error signal generator according to a first aspect of the present invention includes a phase comparator wherein phases of two input pulse signals are compared, the output polarity being changed according to the lead and lag between the pulse signals and the output electric charge proportional to a time difference between the input pulse signals, a front stage capacitor which charges electric charge corresponding to the time difference, an alternating common base transistor of which emitter is coupled to the front stage capacitor, a rear stage capacitor coupled to the collector of the transistor and a switch controller which biases the transistor until the next edges arrive after detecting corresponding edges of two input pulse signals, wherein the time difference voltage for each edge of the input pulse signal generated in the front stage capacitor is transferred sequentially to the rear stage capacitor by the transistor to obtain accumulated voltage on a phase error in the two input pulse signals from the rear stage capacitor.

According to the above construction, the common-base transistor is responsive to the pulse voltage supplied to their base to transfer the electric charge charged in the front stage capacitor to the rear stage capacitor only a duration when the pulse voltage is either high or low. On the other hand, the common-base transistor is responsive to the pulse current supplied to their emitter to transfer the electric charge charged in the front stage capacitor to the rear stage capacitor only a duration when the pulse current is ON.

A phase error signal generator according to a second aspect of the present invention includes a phase comparator for comparing voltages of two input pulse signals to change an active output between first and second outputs so as to make a time difference signal of the two input pulse signals, a front stage capacitor which charges electric charge corresponding to the time difference, first and second common-base transistors of which emitters are coupled to the respective ends of the front stage capacitor; a rear stage capacitor coupled between the collectors of the transistors and a switch controller for biasing the common-base transistors for a period from when two corresponding pulse edges of the two input pulse signals have been detected by the phase comparator to a time when next edges arrive to phase comparator, wherein the electric charge proportional to a time difference for every edge of the input pulse signal appearing across the front stage capacitor is sequentially transferred to the rear stage capacitor by the transistors for every period to obtain accumulated voltage of phase errors in the input pulse signals from the ends of the rear stage capacitor.

A phase error signal generator according to a third aspect of the present invention further includes a pair of first and second differential transistor circuits, in each circuit the emitters being coupled each other and a pair of capacitors, wherein common emitter nodes of the first and second differential transistor circuits being coupled to the collectors of their corresponding common-base transistors; respective one transistors of the first and second differential transistor circuits are coupled to the second and third capacitors through their collectors, the other transistors of the first and second differential transistor circuits are coupled to a constant voltage node like a power supply source or a ground source through their collectors, and wherein, in case of any defective waveform correspondency occurring in combination of the input signals, the pair of the first and second differential transistor circuits prevents transferring of the electric charge charged in the front stage capacitor to the second and third capacitors by being controlled their base biases to bypass the electric charges into the constant voltage node like the power supply source or the ground source.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

The present invention will be described in detail with reference to FIGS. 1 through 5. Throughout the drawings, reference numerals or letters in FIG. 6 will be used to designate like or equivalent elements for simplicity of explanation.

Figure 1:
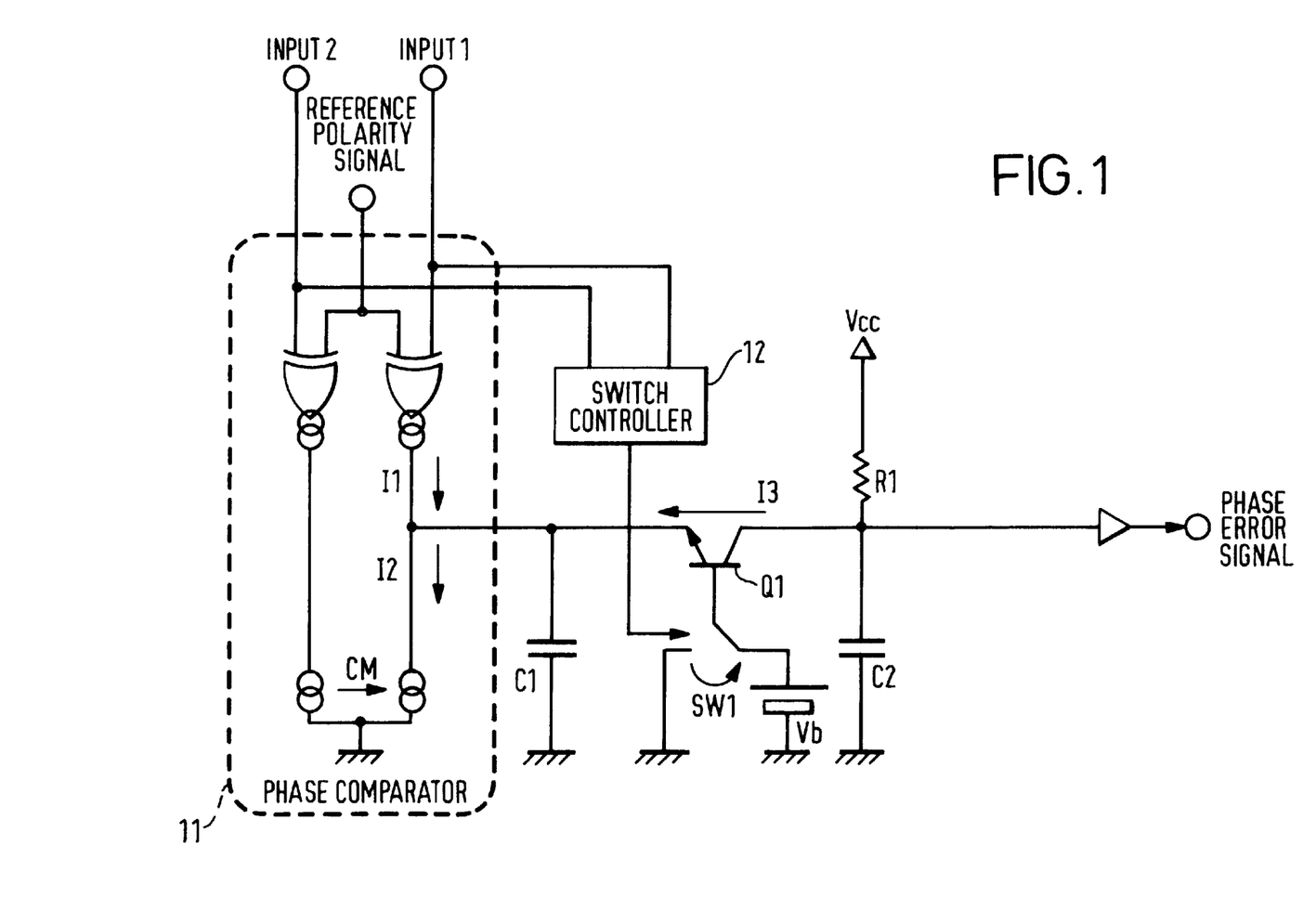
FIG. 1 is a circuit diagram for explaining a first embodiment of the phase error signal generator according to the present invention.

FIG. 1 shows a circuit diagram for explaining a first embodiment of the phase error signal generator according to the present invention. In the first embodiment, an alternating common-base transistor Q1 is used in place of the operational amplifier OP in the conventional circuit, as shown in FIG. 6. EX-OR units in the phase comparator 11 have their associated voltage-current converters for outputting current outputs I1 and I2 from the phase comparator 11. One current output I2 is aliased to the path of the other current output I1 through a current mirror connection CM. Then a difference between the current outputs I1 and I2 is charged into the front stage capacitor C1 of which one end is grounded. The alternating base-grounded transistor Q1 is coupled between the front stage capacitor C1 and a rear stage capacitor C2 of which one end is also grounded, in such a manner that its emitter is coupled to the front stage capacitor C1 while its collector is coupled to the rear stage capacitor C2 and its base is coupled to the switch SW1. The common-base transistor Q1, therefore has a base that alternates between ground and reference voltage Vb, in accordance with the switch SW position. The electric charge is then transferred along the path of the collector current of the transistor Q1. A switch controller 12 is provided for turning over the switch SW1 to the ground or the bias voltage source Vb by referencing the edge timings of the input pulse signals 1 and 2.

When only one of the edges of the corresponding pulses of the inputs 1 and 2 arrives, and the other edge has not yet arrived, the switch SW1 is turned to the ground so that the transistor Q1 is turned OFF and thus the difference in current output is charged into the front stage capacitor C1. When a corresponding edge of the other pulse arrives to the phase comparator 11 so that the phase error information has been detected, the switch SW1 is turned to the bias voltage source Vb. Then the first transistor Q1 is activated so that the electric charge of the front stage capacitor C1 is transferred to the rear stage capacitor C2. When the transfer has been completed, the front stage capacitor C1 is initialized by the voltage "Vb-VBE" (VBE is a base-emitter voltage when the transistor Q1 is ON and is constant). The same operation as that in the conventional circuit, as shown in FIG. 6, is carried out afterthat. Therefore almost all the signals at predetermined portions in the circuit of FIG. 6 have waveforms equivalent to those, as shown in FIG. 7, in the conventional circuit. Since, however, the electric charge is transferred only in the direction from the collector to the emitter of the transistor Q1, it is necessary to setup a bias by adding a constant current to the current 12.

Because the switch control current never peaks within the electric charge transfer path and a single NPN transistor, configured in a common-base fashion, is used for transferring the electric charge, the above embodiment of the present invention can operate at a high speed and a small error rate, and the embodiment can operate with a very small offset.

Figure 2:
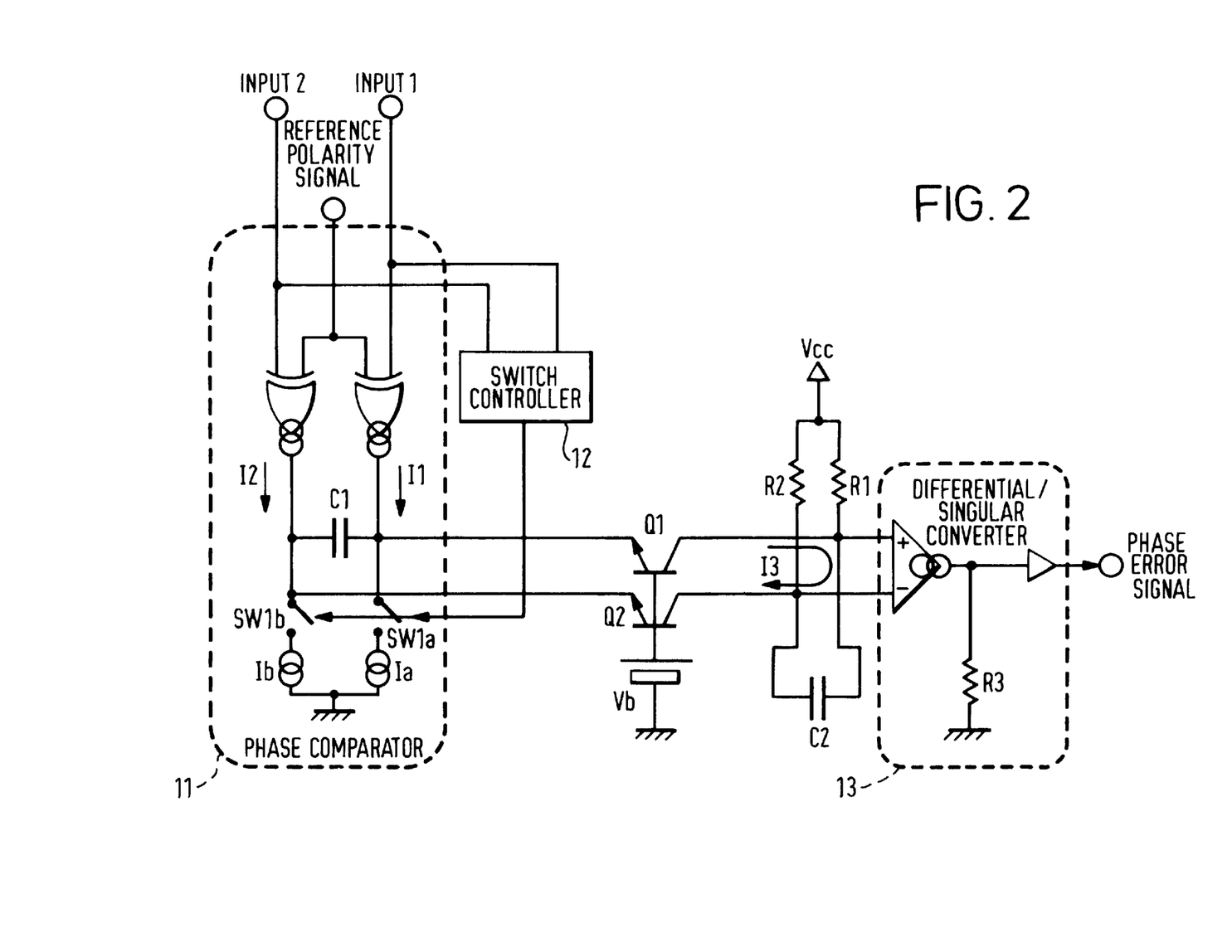
FIG. 2 is a circuit diagram for explaining a second embodiment of the phase error signal generator according to the present invention.

Referring now to FIG. 2, a second embodiment of the present invention will be explained. FIG. 2 shows a circuit diagram for explaining the second embodiment of the phase error signal generator. In this embodiment, a full differential configuration architecture is employed for the electric charge transfer passage, in place of the singular configuration architecture used in the first embodiment, as shown in FIG. 1.

That is, the EX-OR units give constant current outputs when their output levels have High levels. Further, the front stage capacitor C1 is provided across the output terminals of the EX-OR units of the phase comparator 11. A pair of common-base transistors Q1 and Q2 are provided in parallel between the front stage capacitor C1 and the rear stage capacitor C2 in the full differential configuration. Their emitters are coupled across the ends of the front state capacitor C1. Their bases are coupled to the ground source through a common constant voltage bias source Vb. Their collectors are coupled across the ends of the rear stage capacitor C2. Further, the electric charge of the front stage capacitor C1 is transferred by a difference of the collector currents between the transistors Q1 and Q2. In the second embodiment, switches SW1a and SW1b are provided between respective ends of the front stage capacitor C1 and the ground source together with current sources Ia and Ib respectively connected in series thereto. Thus the switches SW1 and SW2 control the current outputs from the EX-OR units of the phase comparator 11. However, the switches SW1a and SW1b can be provided for controlling base biases of transistors, like the transistor Q1 shown in FIG. 1.

In the second embodiment, the electric charge of the front stage capacitor C1 is transferred with the constant current. In the second embodiment as well as the first embodiment, as shown in FIG. 1, the amount of the constant current may be set to a prescribed level which is equivalent to the current level obtained by conventional current limiting resistors. In general, as a duration for discharging electric charges is longer than a duration for charging electric charges, it is enough if the constant current level is set at a little higher than the levels of the current outputs from EX-OR units in the phase comparator 11. In general, a current difference between two current sources causes an offset in a resulted output. However, in the second embodiment the charge transfer circuit is comprised of the same conductivity type transistors (e.g., NPN transistors in this case). Therefore, the amount of the current difference is suppressed below a reasonably low level. The electric charges of the front stage capacitor C1 for every phase comparison are sequentially transferred into the rear stage capacitor C2 and integrated therein, as described before. Thus an integration output arises as a voltage across the ends of the rear stage capacitor C2. The integrated output is then output through a differential/singular converter 13. Thus the phase error signal output from the differential/singular converter 13 is utilized for tracking servo control of pickups.

Figure 3:
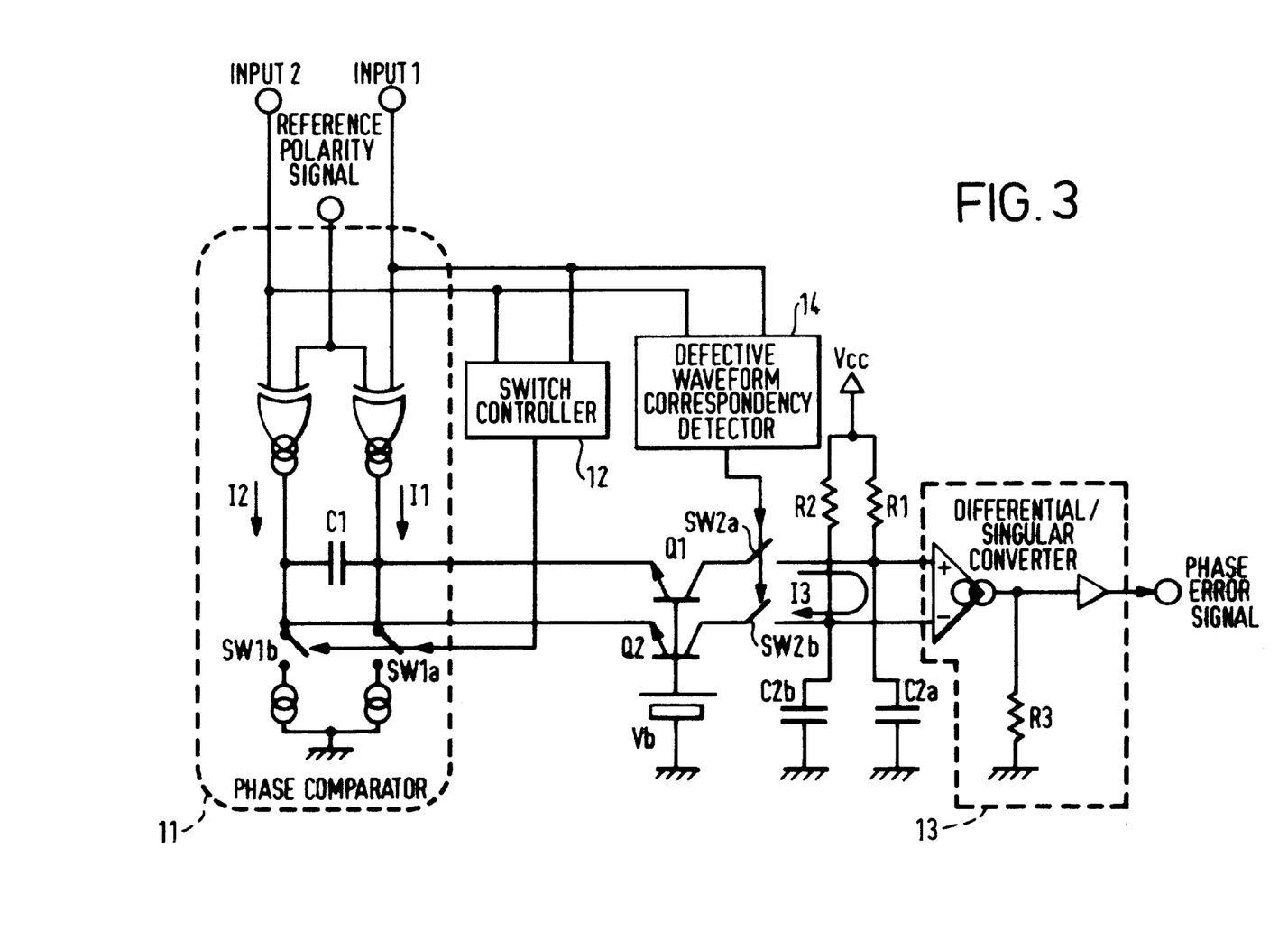
FIG. 3 is a circuit diagram for explaining a third embodiment of the phase error signal generator according to the present invention, wherein the rear stage capacitor, as shown in FIG. 2, is divided into a first and second rear stage sub-capacitors.

Furthermore, in the second embodiment, the switching waveforms associated with the first and second input pulses appear to the common-mode pulse current in the transistors Q1 and Q2 in in-phase condition with each other. Since the differential/singular convertor 13 has generally a large common-mode rejection ratio, the influence of the switching waveforms would be theoretically rejected in the differential/singular convertor 13, thus eliminated in the output therefrom. In practical, however, some non-negligible amount of the in-phase switching waveforms may leak to the output of the differential/singular convertor 13. Then a third embodiment of the present invention, as shown in FIG. 3, is provided for eliminating the leak of the in-phase switching waveform. In this third embodiment, a pair of first and second rear stage sub-capacitors C2a and C2b each grounded its other end is provided in the electric charge transfer channel, in place of the rear stage sub-capacitors C2, as shown in FIG. 3. The time constant associated with the first and second rear stage sub-capacitors C2a and C2b is set to the length in the order that matches the tracking servo bandwidth.

The first and second rear stage sub-capacitors C2a and C2b are desirable to have a relatively large capacity of from thousands pF range to ten thousands pF range. Thus the significant parts of the in-phase pulses with hundreds KHz range to MHz range are rejected by the combination of the first and second rear stage sub-capacitors C2a and C2b. Further the rest of the in-phase pulses are rejected by the differential/singular convertor 13. Thus the in-phase pulses are completely eliminated from the resulted phase error signal detection output.

Figure 4:
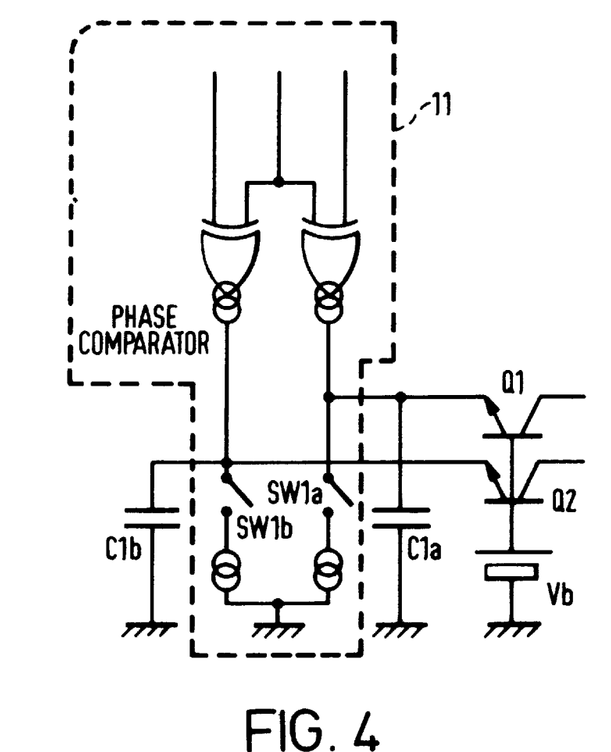
FIG. 4 is a circuit diagram for explaining a fourth embodiment of the phase error signal generator according to the present invention, wherein the front stage capacitor, as shown in FIG. 2, is divided into a first and second front stage sub-capacitors.

Based on a similar consideration, a fourth embodiment of the phase error signal generator according to the present invention, wherein the front stage capacitor, as shown in FIG. 4, is divided into a first and second front stage sub-capacitors C1a and C1b whose one ends are respectively grounded.

In this second embodiment, as shown in FIG. 2, significant part of the circuit is arranged in a full symmetrically differential circuit from the phase comparator 11 to the input stage of the differential/singular convertor 13, a problem of asymmetries in phase between the phase advance and the phase lag can be solved. Further, the leak of the switch control current into the electric charge transfer channel is eliminated so that a high precision of phase error signal can be generated even in a high speed operation.

Furthermore in the third embodiment, as shown in FIG. 3, current switches SW2a and SW2b are inserted between the common-base transistors Q1, Q2 and the first and second rear stage sub-capacitors C2a, C2b, respectively. They are turned OFF when any defective waveform correspondency occurs in the combination of the input pulse signals 1 and 2, thus preventing the charging operations of the first and second rear stage sub-capacitors C2a and C2b.

Such turn ON/OFF operations of the current switches SW2a and SW2b are controlled by a defective waveform correspondency detector 14 which detects any defective waveform occurring in the combination of the input pulse signals 1 and 2, as described above.

Figure 5:
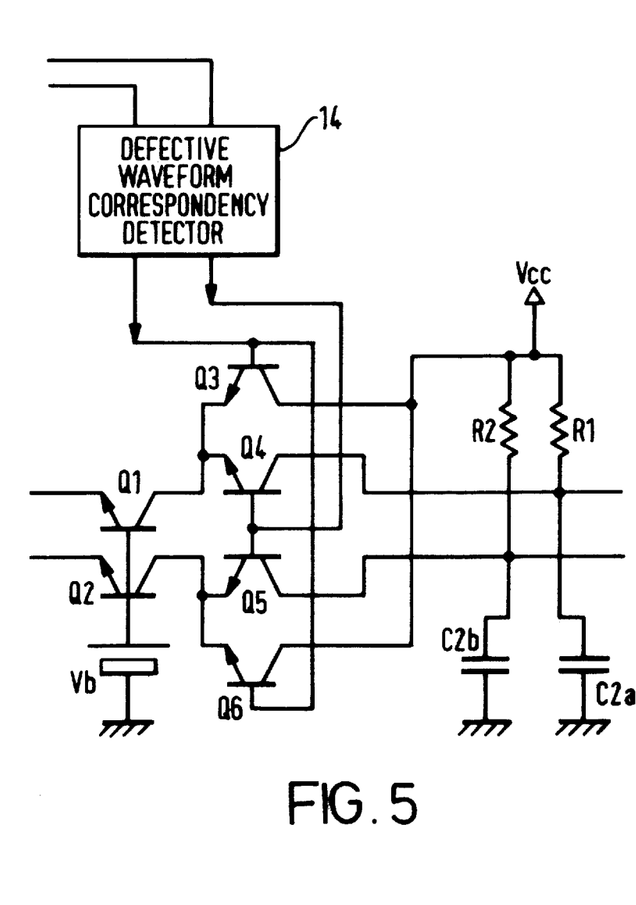
FIG. 5 is a circuit diagram for explaining a fifth embodiment of the phase error signal generator according to the present invention, wherein the current switches, as shown in FIG. 2, are comprised of a pair of differential transistor circuits.

Referring now to FIG. 5, a fifth embodiment of the phase error signal generator according to the present invention, wherein the current switches SW2a and SW2b, as shown in FIG. 2, are comprised of a pair of differential transistor circuits. When the differential transistor circuits are comprised of NPN transistors, like the NPN transistors used for the common-base transistors Q1 and Q2, actual currents associated with charge transfers flow in the direction only from the rear stage sub-capacitors C2a and C2b towards the front stage sub-capacitors C1a and C1b. Therefore, there is no need of using relatively expensive and complicated bidirectional current switches.

Unidirectional current switches can be constructed using a pair of differential transistor circuits of which one differential transistor circuit comprises a pair of NPN transistors Q3 and Q4 whose emitters are coupled to each other, while the other differential transistor circuit comprises another pair of NPN transistors Q5 and Q6 whose emitters are also coupled to each other. In this arrangement, current paths in each differential transistor circuit is switched between the pair of transistors Q3 and Q4, or Q5 and Q6 by controlling bias voltages supplied to the bases. When any defective waveform correspondency in the combination of the first and second input pulse signals 1 and 2 is detected, the defective waveform correspondency detector 14 biases the bases of the transistors Q3 and Q6 into the High level. Then connections of the transistors Q3 and Q6 to the power source Vcc through their collectors are made effective, thus the electric charges from the front stage sub-capacitors C1a and C1b being bypassed to the power source Vcc. When no defective waveform correspondency in the combination of the first and second input pulse signals 1 and 2 is detected, the defective waveform correspondency detector 14 biases the bases of the transistors Q4 and Q5 into the High level. Then connections of the transistors Q4 and Q5 to the first and second rear stage sub-capacitors C2a and C2b through their collectors are made effective, thus the electric charges from the front stage sub-capacitors C1a and C1b being transferred thereto.

Thus, the tracking error signal generation is prevented from undesired offsets affected by errors in the phase error detecting operations error when any defective waveform correspondency occurs in the combination of the input pulse signals. As the base biases to the transistors Q1 through Q6 are controlled, the bias control signals is prevented from their leaks into the electric charge transfer channel, thus no deterioration will result in the performance of the output from the phase error signal generator.

In the embodiments of the present invention described above, the tracking error generation for DVD systems is particularly explained. However the present invention is not limited thereto and applicable to a variety of applications, such as an application to phase control loops in which their phase is controlled in the manner of feedback operation by generating a mean phase error of two signals. In particular, it is highly suitable to applications having needs of detecting phase errors at a high speed and a high accuracy.

As described above, the phase error signal generator according to the present invention is possible to provide enhanced characteristics even in the tracking error signal generation in DVD systems which requires a very high accuracy and a very high speed.

As described above, the present invention can provide an extremely preferable phase error signal generator. While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefor, it is intended that the present invention not be limited to the particular embodiment disclosed as the best mode contemplated for carrying out the present invention, but that the present invention includes all embodiments falling within the scope of the appended claims.

The foregoing description and the drawings are regarded by the applicant as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer or alternative inventive concepts that are included in the contents of the application and could be defined by claims differing in scope from the following claims, which different claims may be adopted subsequently during prosecution, for example, for the purposes of a divisional application.

What is claimed is:

1. A phase error signal generator, comprising:
   a phase comparator for comparing phases of two input pulse signals, said phase comparator having an output with a polarity according to a phase lead or phase lag between the input pulse signals and being proportional to a time difference between the input signals;
   a front stage capacitor for storing an electric charge according to said time difference;
   a transistor arranged in an alternating common-base configuration, having a base capable of alternating between a grounded position and a bias voltage position and having an emitter coupled to said front stage capacitor;
   a rear stage capacitor coupled to a collector of said transistor; and
   a switch controller for controlling said transistor, such that said transistor is conductive when the corresponding edges of said two input pulse signals are detected, and
   wherein an integrated phase error voltage of said two input pulse signals is obtained from said rear stage capacitor by sequentially transferring the electric charge, stored in the front stage capacitor and proportional to the time difference of each edge of the input pulse signals, to the rear stage capacitor.

2. A phase error signal generator, comprising:
   a phase comparator for comparing phases of two input pulse signals, said phase comparator including a first and second output terminal, each terminal having an output with a polarity according to a lead and lag between said two input pulse signals and having an output electric charge proportional to a time difference between said two input signals;
   a front stage capacitor for storing an electric charge according to said time difference;

a first and second transistor arranged in a biased common-base configuration such that each transistor has a base coupled to a common bias voltage and an emitter coupled to respective ends of said front stage capacitor;

a rear stage capacitor coupled to collectors of said first and second transistor; and a switch controller for controlling said transistors, such that said transistors are conductive when the corresponding edges of said two input pulse signals are detected, and wherein an integrated phase error voltage of said two input pulse signals is obtained from the respective ends of said rear stage capacitor by sequentially transferring the electric charge, stored in the front stage capacitor and proportional to the time difference of each edge of the input pulse signals, to the rear stage capacitor.

3. A phase error signal generator according to claim 2, wherein the front stage capacitor is divided into a first and second front stage sub-capacitor coupled to the first and second output terminals of said phase error comparator, respectively.

4. A phase error signal generator according to claim 2, wherein the rear stage capacitor is divided into a first and second rear stage sub-capacitor which are respectively coupled to the collectors of said first and second transistors.

5. A phase error signal generator according to claim 1, wherein the electric charge stored in said front stage capacitor is transferred to said rear stage capacitor by said switch controller switching a base bias voltage of said common-base transistor.

6. A phase error signal generator according to claim 1, wherein the electric charge stored in said front stage capacitor is transferred to said rear stage capacitor by said switch controller switching an emitter current of said common-base transistor.

7. A phase error signal generator according to claim 4, comprising a first and second differential transistor circuit, each of said first and second differential transistor circuits having at least two transistors with their respective emitters connected in common and having the commonly connected emitters of each circuit coupled to the collector of one of said first and second common-base transistors, respectively, and each of said first and second differential transistor circuits having a collector of one of said transistors respectively coupled to one of said first and second rear stage sub-capacitors and having a collector of another of said transistors respectively coupled to a constant voltage node;

wherein, in case of any defective waveform occurring in combination of the input pulse signals, said first and second differential transistor circuits prevent the transfer of the electric charge stored in the front stage capacitor to said first and second rear stage capacitors by biasing a transistor in said first and second differential transistor circuits in order to bypass the electric charge into the constant voltage node.

8. A phase error signal generator according to claim 1 or claim 2, further comprises means, responsive to any defective waveform occurring in the combination of the input pulse signals, for shutting off the output of said phase comparator.

9. A phase error signal generator, for generating a phase error signal corresponding to the phase error between input pulse signals, comprising:

a first capacitor means, for storing an electric charge corresponding to the phase difference between the input signals;

a transistor means arranged in an alternating common-base configuration, having a base means capable of alternating between a grounded position and a bias voltage position and having an emitter means coupled to the first capacitor means;

a second capacitor means, coupled to the collector means of the first transistor means;

means operable to activate the transistor means to cause the transfer of charge from the first capacitor means to the second capacitor means; and output means for outputting a phase error signal based on the second capacitor means.

10. A phase error signal generator according to claim 2, wherein the electric charge stored in said front stage capacitor is transferred to said rear stage capacitor by said switch controller switching a base bias voltage of at least one of said first and second common-base transistors.

11. A phase error signal generator according to claim 2, wherein the electric charge stored in said front stage capacitor is transferred to said rear stage capacitor by said switch controller switching an emitter current of one of said first and second common-base transistors.

* * * * *